United States Patent
Mizoguchi et al.

(10) Patent No.: US 6,356,079 B1
(45) Date of Patent: Mar. 12, 2002

(54) PHASE-SHIFT TYPE MAGNETIC-FIELD SENSOR USING A MAGNETIC SUBSTANCE

(75) Inventors: Tetsuhiko Mizoguchi; Tetsuo Inoue, both of Yokohama; Toshiro Sato, Nagano, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/459,909

(22) Filed: Dec. 14, 1999

(30) Foreign Application Priority Data

Dec. 14, 1998 (JP) .......................... 10-354703

(51) Int. Cl.[7] .............................. G01R 33/02
(52) U.S. Cl. ................. 324/249; 324/244; 331/65
(58) Field of Search .................... 324/236, 244, 324/249, 250, 253–255, 258, 260, 345; 331/65; 33/355 R, 363 R (56) References Cited

U.S. PATENT DOCUMENTS

| | | | | |
|---|---|---|---|---|
| 3,239,754 A | * | 3/1966 | Odom, Jr. et al. | 324/249 X |
| 3,416,072 A | * | 12/1968 | Fussell et al. | 324/249 |
| 3,703,681 A | * | 11/1972 | Johnson et al. | 324/249 |
| 4,305,034 A | * | 12/1981 | Long et al. | 324/258 X |
| 4,384,254 A | * | 5/1983 | Brown | 324/253 |
| 4,851,775 A | * | 7/1989 | Kim et al. | 324/260 X |
| 5,015,952 A | * | 5/1991 | Doss | 324/236 |
| 5,239,264 A | * | 8/1993 | Hawks | 324/253 |
| 5,495,170 A | * | 2/1996 | Feeney et al. | 324/236 |

FOREIGN PATENT DOCUMENTS

| | | |
|---|---|---|
| JP | 06-176930 | 6/1994 |
| JP | 07-244137 | 9/1995 |
| JP | 09-133742 | 5/1997 |
| JP | 10-078477 | 3/1998 |

* cited by examiner

Primary Examiner—Gerard R. Strecker
(74) Attorney, Agent, or Firm—Finnegan, Henderson, Farabow, Garrett & Dunner, L.L.P.

(57) ABSTRACT

The present invention provides a magnetic-field sensor using a magnetic substance. In the magnetic-field sensor, a transmission-line element constituted of a conductor layer, dielectric layer and a magnetic layer is inserted in a feedback circuit of a phase-shift type oscillation circuit using an open-loop operational amplifier as an amplifier. An output of the operational amplifier is fed back to an input thereof through the transmission-line element. Thus, a variation in oscillation frequency depending upon the intensity of an external magnetic field is detected as an output of the sensor.

23 Claims, 7 Drawing Sheets

PHASE-SHIFT TYPE MAGNETIC-FIELD SENSOR USING A MAGNETIC SUBSTANCE

BACKGROUND OF THE INVENTION

The present invention relates to a magnetic-field sensor using a magnetic substance and, more particularly, to a magnetic-field sensor of a frequency modulation (variation) type.

A magnetic-field sensor has recently been used in various fields for a resources survey based on geomagnetic anomalies, a car navigation system (e.g., an azimuth sensor type), and biomagnetics instrumentation. Most of magnetic-field sensors were of a flux-gate type and a magnetic multivibrator type employing nonlinear magnetic characteristics of a magnetic substance. Recently, a magnetic impedance effect type utilizing variations in high-frequency resistance of a magnetic substance with an external magnetic field because of skin effects and a high-frequency carrier type for sensing variations in high-frequency magnetic permeability with an external magnetic field, have been developed as magnetic-field sensors using magnetic substances.

A Hall device is a typical magnetic-field sensor using a semiconductor. Further, the application of an superconducting quantum interference device (SQUID) fluxmeter to an magnetoencephalogram (MEG) diagnostic apparatus is proceeding toward commercialization as leading-edge technology in medical diagnosis.

These latest magnetic-field sensors, described above, have been studied and actively announced in the Magnetics Society of Japan, the Institute of Electrical Engineers of Japan, and the Biomagnetics Society of Japan.

The above variety of magnetic-field sensors are appropriately utilized in view of magnetic field detection limits, costs, and specific applied technology matching. In particular, the sensors used for consumer products need to both decrease in cost and size and increase in sensitivity.

In magnetic-field sensors using a magnetic substance, a sensor having nonlinear magnetic characteristics should be constructed such that the magnetic substance itself is excited by a large amplitude at high frequency. Such a sensor has problems of causing an iron copper loss. There were limits to achieving high frequencies. Further, the sensor has a problem that its power consumption is high. Contrastingly, a magnetic-field sensor of a magnetic impedance effect type or a high-frequency carrier type is so designed that its magnetic substance is excited by a small amplitude of high-frequency current flowing therethrough. Therefore, both miniaturization and high sensitivity are compatible with each other and, at the same time, power consumption can be lowered.

However, it is in the mainstream prior art magnetic-field sensor using a magnetic substance that an external magnetic field is converted into a voltage. Even though such a sensor is a magnetic impedance effect type or a high-frequency carrier type, it has drawbacks in which its peripheral analog electronic circuit are increased in size and it is susceptible to an influence of noise on which detection limits of magnetic fields depended.

Figure 1:
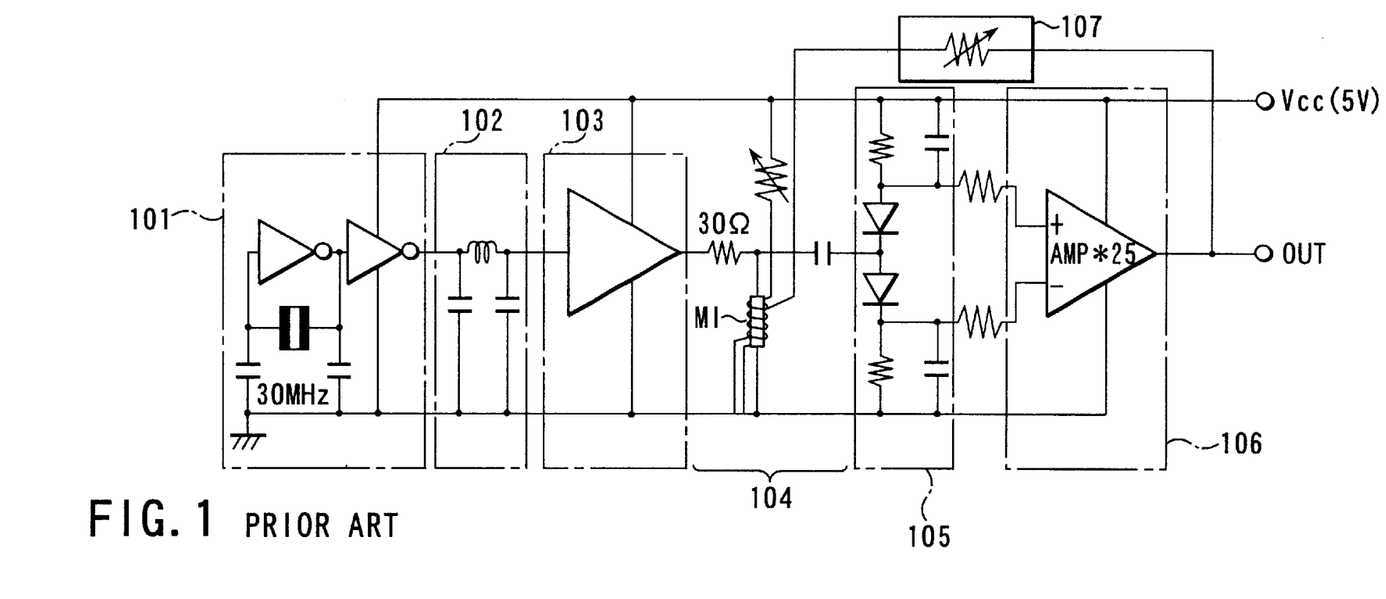
FIG. 1 is a circuit diagram showing an example of a prior art magnetic-field sensor.

FIG. 1 schematically shows the arrangement of a prior art magnetic-field sensor (sensor circuit) of a magnetic impedance effect type. This magnetic-field sensor includes an oscillation section 101, a filter section 102, a buffer section 103, a sensor section 104, a detection section 105, an amplifier section 106, and a negative feedback resistor 107.

Oscillation section 101 is a pulse generation circuit having a complementary metal oxide semiconductor (CMOS) inverter and a quartz oscillator. Filter section 102 is an LC filter for removing a basic-frequency component from repetitive waveforms of pulses generated by oscillation section 101. Buffer section 103 has a driver amplifier for supplying a sinusoidal high-frequency current, which corresponds to the basic frequency component removed from filter section 102, to a magnetic-field element MI of sensor section 104.

Sensor section 104 includes the magnetic-field element MI and a resistance (30 Ω) which is considerably higher than the impedance thereof and is so constructed that the magnetic-field element MI is driven at constant current by the driver amplifier. The magnetic-field element MI generates a voltage, which is proportionate to variations in impedance with the application of external magnetic fields, from both ends thereof. For the magnetic-field element MI, an amorphous magnetic wire is used as a magnetic substance.

In detection section 105, positive and negative half cycles of a voltage generated from the magnetic-field element MI, whose DC component is cut by a capacitor of sensor section 104, are detected and smoothed by a diode and converted into a DC voltage.

Amplifier section 106 is constructed of a DC differential amplifier (AMP*25). A DC voltage, which is proportional to the amplitude of the positive half cycle of the voltage generated from the magnetic-field element MI, is applied to one input terminal of the amplifier, while a DC voltage, which is proportional to that of the negative half cycle thereof, is applied to the other input terminal of the amplifier. If, in amplifier section 106, the output of the differential amplifier is set to zero when an external magnetic field is zero, only one input voltage is varied and a voltage corresponding to the variation is output (OUT).

Negative feedback resistor 107 is a current control element for causing a direct current (coil current) to flow through a coil wound around the magnetic-field element Ml. In this case, the direction of a DC magnetic field generated by the coil current is the same as that of the external magnetic field, and the DC magnetic field is employed as a bias for increasing the linearity and sensitivity of the magnetic field and output voltage.

Since, as described above, the magnetic-field sensor generates an analog voltage, the peripheral analog electronic circuit other than sensor section 104 is increased in size. Actually, in most cases, the magnetic-field sensor is combined with a microprocessor or the like into a system. For example, an output voltage (OUT), which is proportional to the magnetic field, is converted to digital data by an A/D converter and then the digital data is processed by a micro processor. A result of the digital processing is displayed or used for various control operations.

The best way to achieve an analog electronic circuit which is unsusceptible to an influence of noise as a peripheral circuit of the magnetic-field sensor is narrowing the frequency band. It is however difficult to detect a magnetic field varying at high speed.

Considering that the data is finally processed digitally, the analog output (output voltage OUT) of the magnetic-field sensor will include quantization noise as well as noise from the peripheral analog electronic circuit.

As described above, most of magnetic-field sensors, using a magnetic substance, output an analog voltage. Thus, they are easily influenced by noise. Furthermore, these magnetic-field sensors have problems in which the sensor is difficult to miniaturize and manufacture at low cost as an entire system since the peripheral analog electronic circuit is increases in size.

BRIEF SUMMARY OF THE INVENTION

The object of the present invention is to provide a magnetic-field sensor which is decreased in size and cost and is capable of containing a peripheral circuit with the fewest possible analog electronic circuits and reducing an influence of noise.

To attain the above object, there is provided a magnetic-field sensor which is constructed by inserting a transmission-line element including a conductor layer, a dielectric layer and a magnetic layer in a feedback circuit of a phase-shift type oscillation circuit.

According to the magnetic-field sensor so constructed, an output of the sensor can be detected as a variation in frequency proportional to the intensity of an external magnetic field. Thus, the entire structure of the sensor including the peripheral circuit can be greatly simplified.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 2:
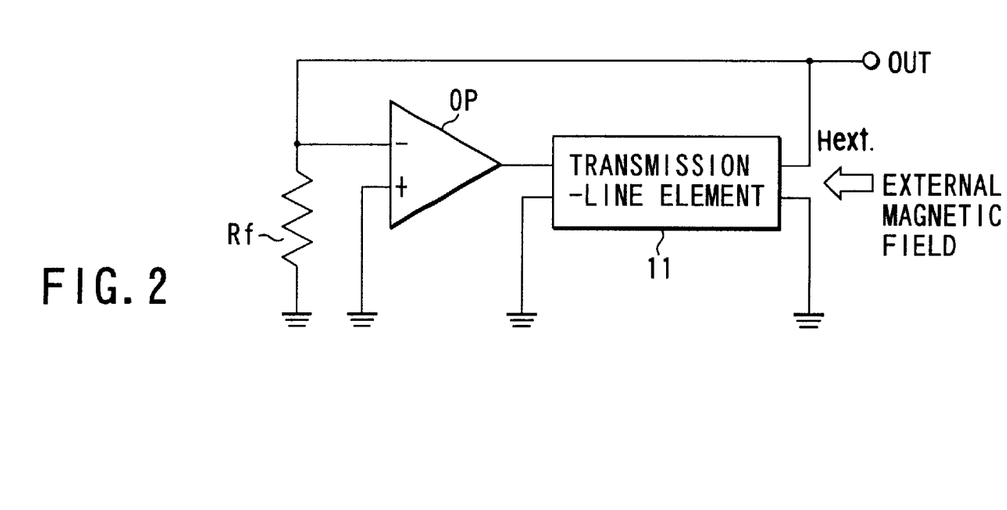
FIG. 2 is a circuit diagram schematically showing a magnetic-field sensor according to a first embodiment of the present invention.

FIG. 2 schematically shows a circuit arrangement of a magnetic-field sensor (sensor circuit) according to a first embodiment of the present invention. The magnetic-field sensor is so constructed that a transmission-line element 11 (which will be detailed later) is inserted in a feedback circuit of a phase-shift type oscillation circuit including an open-loop operational amplifier OP.

A non-inverting (+) input terminal of the operational amplifier OP is connected to a ground potential. An inverting (−) input terminal of the amplifier OP is connected to a ground potential through a resistor $R_f$, and an output terminal of the amplifier OP is feedback-connected to the inverting input terminal through transmission-line element 11. The phase-shift type oscillation circuit is thus constituted.

Figure 3:
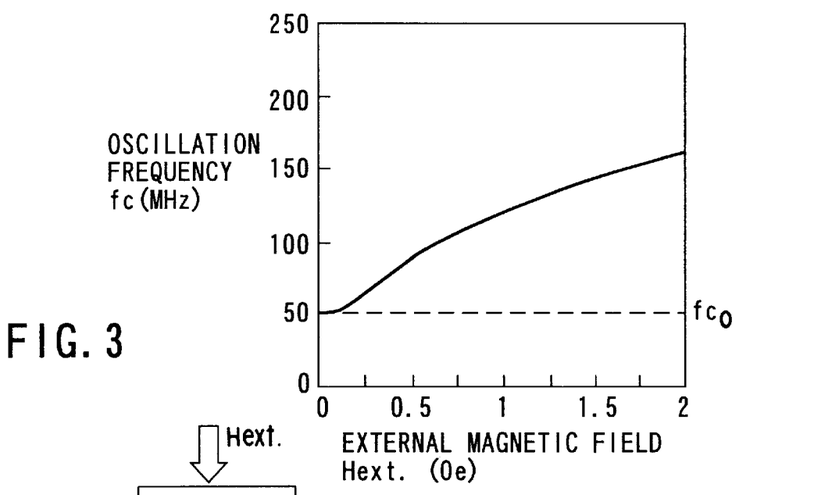
FIG. 3 is a graph representing characteristics of the magnetic-field sensor shown in FIG. 2.

In the magnetic-field sensor so constructed, as shown in FIG. 3, variation or modulation of oscillation frequency fc, which depends upon the intensity of an external magnetic field Hext. can be detected as a sensor output (OUT).

Figure 4A:
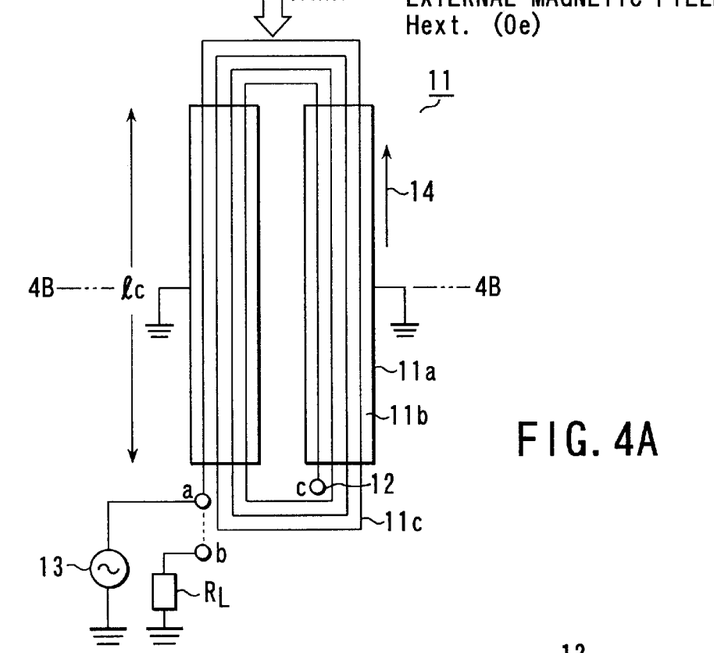
FIG. 4A is a schematic plan view of a transmission-line element used in the magnetic-field sensor shown in FIG. 2.
Figure 4B:
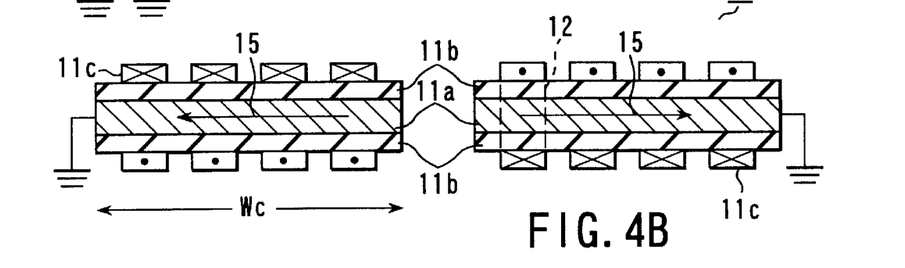
FIG. 4B is a schematic cross-sectional view of the transmission-line element, taken along line 4B—4B of FIG. 4A.

FIGS. 4A and 4B illustrate a structure of the transmission-line element 11 used in the above magnetic-field sensor. Of these figures, FIG. 4A is a partly-simplified plan view and FIG. 4B is an enlarged cross-sectional view taken along line 4B—4B of FIG. 4A.

Transmission-line element 11 has a multilayer structure in which upper and lower dielectric layers 11b are formed on top and bottom surfaces of each of two almost rectangular soft magnetic metal layers (magnetic layers) 11a (length: $l_c$, width: $W_c$), and upper and lower conductor lines (spiral coils) serving as a conductor layer having a spiral plane pattern are formed on their respective surfaces of upper and lower dielectric layers 11b.

Upper and lower conductor lines 11c are connected to each other at a contact portion 12 (point c). One end (point a) of the upper and lower conductor lines are grounded via an AC power supply 13, and the other end (point b) thereof is grounded through a resistor $R_L$.

Soft magnetic metal layers 11a can be each made of a Co-type amorphous film (a thin soft-magnetic band or thin soft-magnetic film using metal materials) having a thickness of about 3 µm, and connected to a ground potential. Further, layers 11a are each provided with uniaxial magnetic anisotropy in its longitudinal direction. A magnetization easy axis 14 of the layers 11a is substantially parallel with the longitudinal direction of conductor lines 11c.

Dielectric layers 11b are each formed of, for example, a polyimide film having a thickness of about 3 µm.

Upper and lower conductor lines 11c are each made of a copper layer having an almost rectangular section and a thickness of about 10 µm. They are so arranged that an alternating magnetic field having a frequency corresponding to the oscillation frequency fc is applied to soft magnetic metal layers 11a in their widthwise directions (indicated by arrows 15 in FIG. 4B).

The size of transmission-line element 11 is 3.65 mm×10.10 mm. When the external magnetic field Hext. is zero, the frequency (¼ wavelength tuning frequency when no magnetic field is applied) $f_{c0}$ at which the line length $l_c$ of element 11 is ¼ the standing-wavelength, is about 50 MHz.

If transmission-line element 11 having the above structure is applied to a feedback circuit of the phase-shift type oscillation circuit, an oscillation frequency fc of the phase-shift type oscillation circuit can be detected as an output of the magnetic-field sensor, the oscillation frequency $f_c$ corresponding to the transmission characteristics (gain and phase) of transmission-line element 11 which are changed with a variation in magnetic permeability of soft magnetic metal layers 11a by the external magnetic field Hext (see FIG. 3).

The basic structure of a transmission-line element based on which the foregoing transmission-line element 11 is constructed, will be described hereinafter.

Figure 5A:
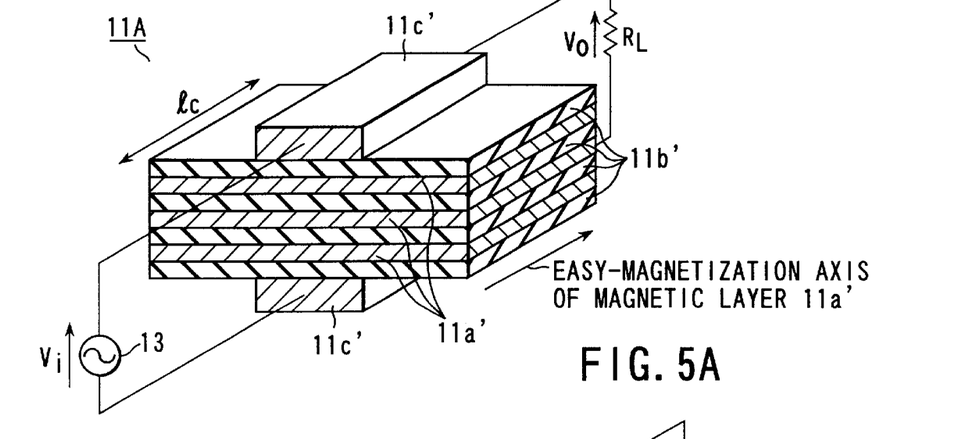
FIGS. 5A to 5C are schematic perspective views each illustrating a basic structure of the transmission-line element.
Figure 5B:
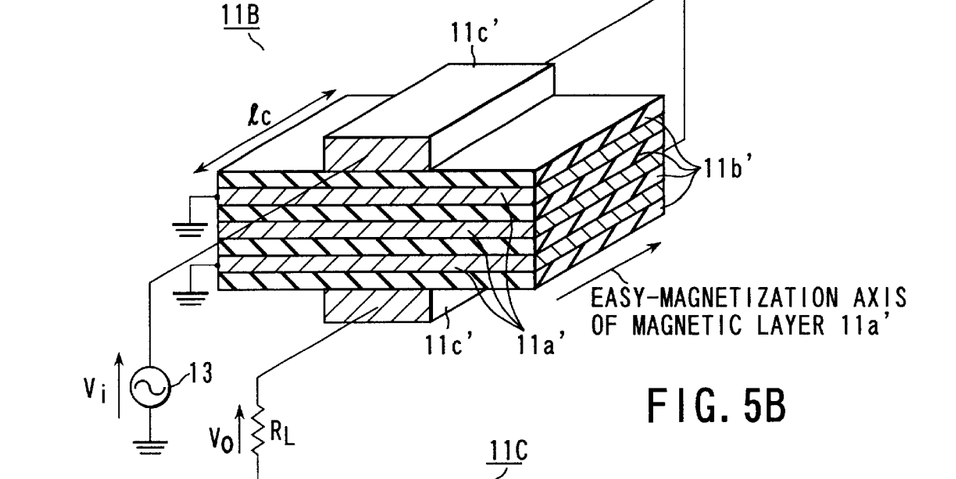
Figure 5C:
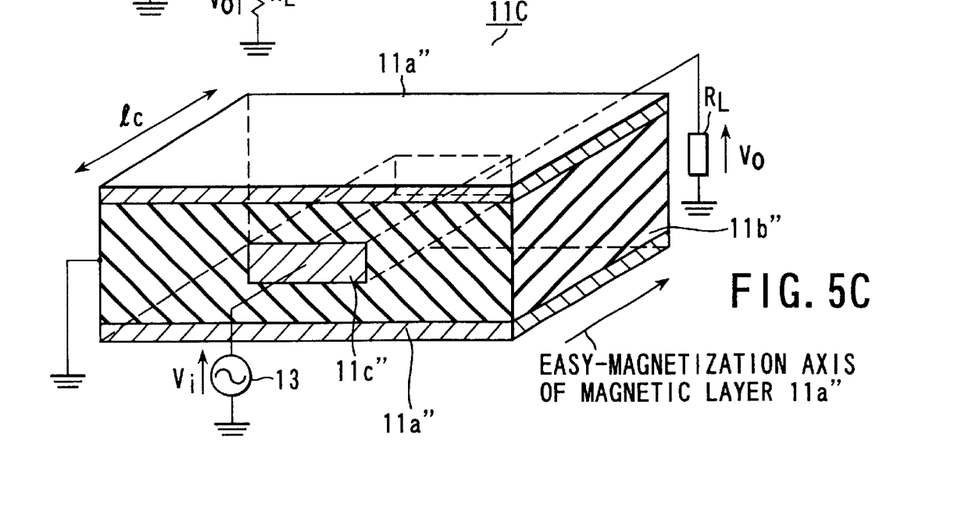

FIGS. 5A to 5C illustrate a basic structure of a transmission-line element for use in a feedback circuit of a phase-shift type oscillation circuit of a magnetic-field sensor.

Referring to FIGS. 5A and 5B, transmission-line elements 11A and 11B each have a multilayer structure in which magnetic layers 11a' and dielectric layers 11b' are alternately stacked one on top of another and conductor layers 11c' are formed on their respective surfaces of the uppermost and lowermost dielectric layers 11b'.

The magnetic layers 11a' are each constructed of an almost rectangular, thin soft-magnetic band or film and provided with uniaxial magnetic anisotropy in its longitudinal direction. The magnetization easy axis of magnetic layers 11a' is substantially parallel with the longitudinal direction of conductor layers 11c'.

Conductor layers 11c' are each formed to have an almost rectangular plane pattern. They are so arranged that an alternating magnetic field having a frequency corresponding to the oscillation frequency of the phase-shift type oscillation circuit is applied to magnetic layers 11a' in their widthwise directions.

In transmission-line element 11A shown in FIG. 5A, one end of upper conductor layer 11c' is connected to that of lower conductor layer 11c' through an AC power supply 13, while the other end thereof is connected to that of lower conductor layer 11c' through a resistor $R_L$. If magnetic layers 11a' are formed of metal materials, they are set to a floating potential. The distributed capacitence of transmission-line element 11A is thus determined in such a manner that the capacitances corresponding to respective dielectric layers 11b' are connected in series.

In transmission-line element 11B shown in FIG. 5B, upper and lower conductor layers 11c' are connected at one end directly to each other. The other end of upper conductor layer 11c' is grounded through an AC power supply 13, while that of lower conductor 11c' *is grounded through a resistor $R_L$.* If magnetic layers 11a' are formed of metal materials, magnetic layers 11a' closest to the upper and lower conductor layers 11c' are each set to a ground potential. The distributed capacitance of the transmission-line element 11B is thus determined by the capacitance corresponding to these magnetic layers 11a'.

The distributed capacitance of transmission-line element 11B is considerably larger than that of transmission-line element 11A. Consequently, when the distributed inductances of elements 11A and 11B are almost the same, the grounding of magnetic layers 11a' produces a good result of shortening the standing-wave wavelength of a line and is favorable for miniaturizing the elements. Transmission-line element 11 shown in FIGS. 4A and 4B was manufactured based on basic structures of transmission-line element 11B.

Transmission-line element 11C illustrated in FIG. 5C is so constructed that a dielectric layer 11b" covers the periphery of a conductor layer 11c" and a magnetic layer 11a" is formed on each of the top and bottom surfaces of dielectric layer 11b". Dielectric layer 11b" is electrically grounded. One end of conductor layer 11c" is grounded through an AC power supply 13, as is the other end thereof through a resistor $R_L$.

The distributed capacitance of transmission-line element 11C is thus determined in such a manner that the capacitances corresponding to upper and lower portions of dielectric layer 11b" are connected in parallel.

Transmission-line element 11 can be constructed on the basis of a great variety of structures other than those of elements 11A, 11B and 11C. An appropriate structure can be selected in consideration of manufacture simplification, costs, and performance.

Conductor layers 11c' and 11c" are not limited to a rectangular plane pattern. For example, they can be formed to have a square, elliptic, spiral, or snaky pattern.

The principle of the magnetic-field sensor of the present invention will now be described.

Figure 6:
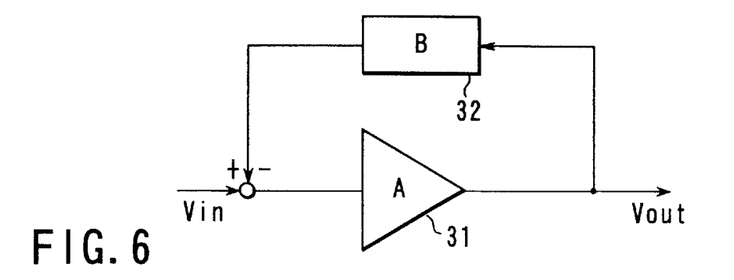
FIG. 6 is a schematic circuit diagram of a feedback amplifier circuit for explaining basic principles of a magnetic-field sensor.

FIG. 6 is a circuit diagram schematically showing a feedback amplifier circuit (phase-shift type oscillation circuit) to explain the basic principle of the magnetic-field sensor. The feedback amplifier circuit includes an amplifier 31 and a feedback circuit 32. An output Vout of the amplifier 31 is fed back to an input Vin of amplifier 31 via feedback circuit 32.

An input/output transfer function G of the feedback amplifier circuit is expressed by the following equation (1):

$$G = \frac{A}{1+AB} \quad (1)$$

If a gain A of amplifier 31 and a feedback factor B of feedback circuit 32 are given by the following equations (2) and (3), the feedback amplifier circuit oscillates under the following conditions (4) and (5):

$A = A_0 e^{-j\theta_A}$ (2)

$B = B_0 e^{-j\theta_B}$ (3)

$A + \theta B = \pm \pi$: phase condition for positive feedback (4)

$A \cdot B_0 > 1$: gain condition for oscillation continuation (5)

The phase-shift type oscillation circuit shifts a phase of an output Vout of amplifier 31 in the feedback circuit 32 and continues to oscillate by satisfying both the above phase and gain conditions (4) and (5). It is general that a CR circuit is employed in feedback circuit 32. The left side $A_0 \cdot B_0$ of the condition (5) is referred to as a loop gain.

According to the present invention, a transmission-line element containing a magnetic substance is used in the feedback circuit of the phase-shift type oscillation circuit. If the magnetic permeability of the magnetic substance is varied with the external magnetic field, the transmission characteristics (gain and phase) of the transmission-line element are changed and accordingly a variation in oscillation frequency, which depends upon the intensity of the external magnetic field, is detected as a sensor output. It is thus needless to say that the magnetic-field sensor of the present invention is more excellent in noise immunity than a prior art magnetic-field sensor which outputs an analog voltage proportional to the intensity of a magnetic field.

Since, furthermore, the sensor of the present invention includes only the phase-shift type oscillation circuit as a peripheral circuit, the number of parts is small, with the result that it is expected that the sensor can be reduced in size, decreased in cost and improved in reliability as a system.

Figure 7:
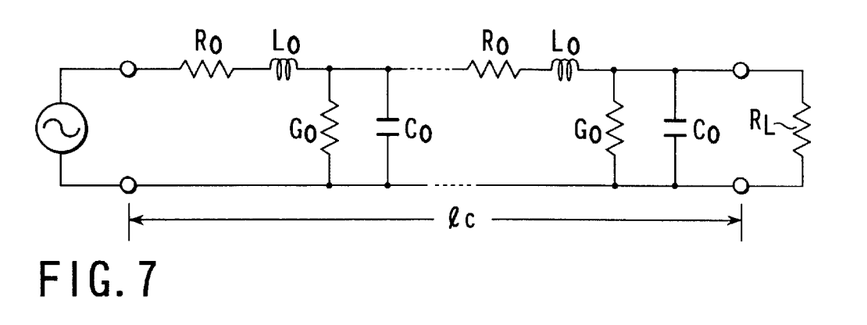
FIG. 7 is a circuit diagram representing the transmission-line element as an equivalent distributed constant line.

FIG. 7 shows a transmission-line element (see FIGS. 5A and 5B, for example), which is used in the feedback circuit of the phase-shift type oscillation circuit, as a distributed-constant line having a length $l_c$. When the line terminates with propagation constant y, characteristic impedance $Z_c$, and resistance $R_L$, voltage gain Gv and input impedance Zin are given by the following equations (6) to (9):

$$\gamma = \sqrt{(R_0 + j\omega L_0)(G_0 + j\omega C_0)} \quad (6)$$
$$= \alpha + j\beta$$

$$Z_C = \sqrt{\frac{R_0 + j\omega L_0}{G_0 + j\omega C_0}} \quad (7)$$

$$Gv = \frac{R_L}{R_L\cosh(\gamma l c) + Z_C\sinh(\gamma l c)} \quad (8)$$

$$Zin = \frac{Z_C R_L\cosh(\gamma l c) + Z_C^2\sinh(\gamma l c)}{Z_C\cosh(\gamma l c) + R_L\sinh(\gamma l c)} \quad (9)$$

where $R_0$ is a distributed resistance, Lo is a distributed inductance, $G_0$ is a distributed conductance, and $C_0$ is a distributed capacitance. In the above equation (6), $\alpha$ is an attenuation constant and $\beta$ is a phase constant.

If, in particular, both the distributed resistance $R_0$ and distributed conductance $G_0$ are low and a line loss is negligible, the voltage gain (Gv, ¼) at the frequency $f_c$ (¼ wavelength tuning frequency) at which the line length $l_c$ is ¼ the standing-wave wavelength, and the input impedance (Zin, ¼) are expressed by the following equations (10) and (11):

$$Gv, 1/4 = -j\frac{R_L}{Z_C} \quad (10)$$

$$Zin, 1/4 = \frac{Z_C^2}{R_L} \quad (11)$$

Thus, the output voltage is delayed by π/2 (rad) behind the input voltage (θB=−π/2). The frequency $f_c$ is represented by the following equation (12):

$$fc = \frac{1}{4lc}\sqrt{\frac{1}{L_0 C_0}} \quad (12)$$

On the other hand, the voltage gain (Gv, ½) at the frequency $2f_c$ (½ wavelength tuning frequency) at which the line length $l_c$ is ½ the standing-wave wavelength, and the input impedance (Zin, ½) are expressed by the following equations (13) and (14):

$$Gv, ½=−1 \quad (13)$$

$$Zin, ½=R_L \quad (14)$$

Thus, the output voltage is delayed by π (rad) behind the input voltage (θB=π/2).

The following Table 1 indicates phase conditions for oscillation when the above transmission-line element is used in the feedback circuit of the phase-shift type oscillation circuit.

TABLE 1

| Oscillation frequency | θA | θB |
|---|---|---|
| fc | −π/2 | −π/2 |
| 2fc | 0 | −π |

In order to set the oscillation frequency to ¼ wavelength tuning frequency $f_c$, a phase delay θA of the amplifier 31 has only to be π/2(rad). Further, in order to set the oscillation frequency to ½ wavelength tuning frequency $2f_c$, the phase delay θA has only to be zero.

Figure 8:
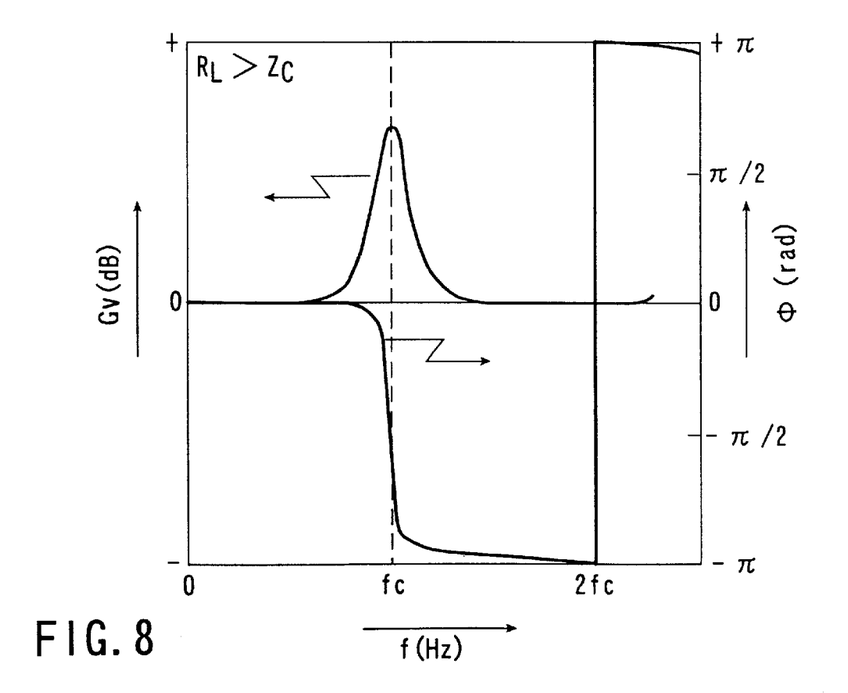
FIG. 8 is a graph showing a relationship between voltage gain Gv and phase $\phi$ of the transmission line element in a typical frequency characteristic.

FIG. 8 shows a relationship between the voltage gain Gv and phase φ of the transmission-line element when the frequency characteristic is typical. As is apparent from FIG. 8, the phase varies sharply near the ¼ wavelength tuning frequency $f_c$, while it varies gently near the ½ wavelength tuning frequency $2f_c$. It is thus preferable that the ¼ wavelength tuning frequency $f_c$ be selected as an oscillation frequency from the viewpoint of the oscillation frequency stability of the phase-shift type oscillation circuit.

The magnetic-field sensor of the present invention is developed based on the fact that the distributed inductance $L_0$ changes with variations in magnetic permeability of a magnetic layer due to the external magnetic field $H_{ext}$ and the oscillation frequency (¼ wavelength tuning frequency) fc is varied with the external magnetic field $H_{ext}$.

Hereinafter a relationship between the external magnetic field $H_{ext}$ and the oscillation frequency $f_c$ of the phase-shift type oscillation circuit will be described in detail.

A thin soft-magnetic alloy band or a thin soft-magnetic alloy film is used simply for a magnetic layer of the transmission-line element (e.g., the soft-magnetic metal layer 11a shown in FIGS. 4A and 4B) in terms of the advantages of lessening antimagnetic-field effects and suppressing high-frequency loss. Such a magnetic layer can easily be formed by an established method. For example, a melt extraction method can be used for forming a thin soft-magnetic amorphous alloy band, and vacuum evaporation or sputtering can be employed for forming a thin soft-magnetic alloy film.

In most cases, the magnetic layer used in the transmission-line element is formed like a square or a rectangle.

Figure 9:
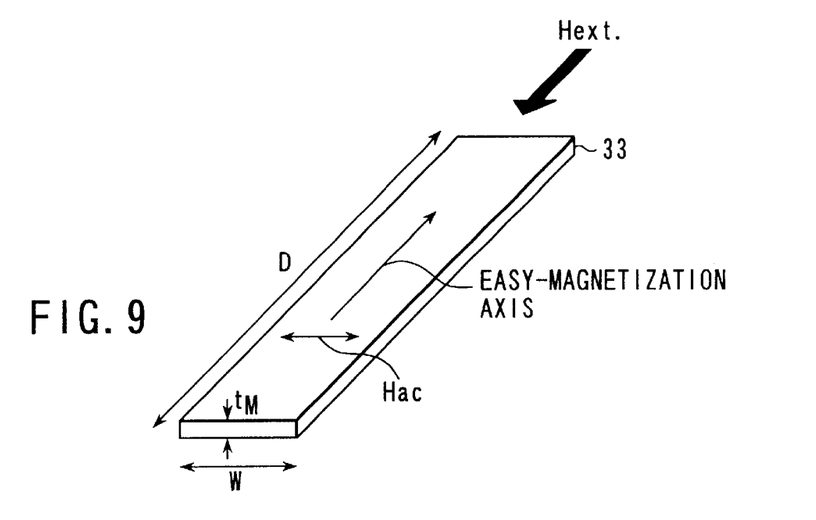
FIG. 9 is a schematic perspective view illustrating a magnetic layer used in the transmission-line element.

FIG. 9 schematically shows the constitution of magnetic layer 33 used in the transmission-line element. For example, magnetic layer 33 is almost rectangular and has a thickness $t_M$, a width W, and a length D. Layer 33 is provided with uniaxial magnetic anisotropy in its longitudinal (lengthwise) direction, and the actual anisotropic magnetic field is set to $H_{ki}$ (not shown). Layer 33 is also provided with an AC magnetic field $H_{ac}$ in its widthwise direction.

The AC magnetic field $H_{ac}$ is generated by an alternating current I flowing through the conductor lines of the transmission-line element (for example, conductor layers 11c shown in FIGS. 4A and 4B). For this reason, in order to obtain a desired AC magnetic field $H_{ac}$, the elements have only to be so arranged that the longitudinal direction of magnetic layer 33 is substantially parallel with the conductor lines.

Assuming that the external magnetic field $H_{xer}$ is applied to magnetic layer 33 in the longitudinal direction, the magnetic permeability $\mu_w$ thereof in the widthwise direction can be approximated as expressed by the following equations (15) and (16):

$$\mu_w \approx \frac{I_s}{H_{ki} + N_w \cdot I_s / \mu_0 \cdot H_0} \quad (15)$$

$$H_0 = H_{ext} - N_D \cdot I_D / \mu_0 \quad (16)$$

where Nw and ND indicate antimagnetic-field coefficients in the widthwise and lengthwise directions of magnetic layer 33, respectively, $I_s$ is saturation magnetization, $H_0$ is an effective magnetic field applied to magnetic layer 33 in the longitudinal direction, $\mu_0$ is magnetic permeability of magnetic materials, and $I_D$ is intensity of magnetization in the longitudinal direction when the effective magnetic field is $H_0$. As the effective magnetic field $H_0$ increases, the magnetization intensity $I_D$ is saturated, arriving at the saturation magnetization Is.

If, as described above, the external magnetic field $H_{ext}$ is applied to the rectangular magnetic layer 33 in the longitudinal direction, the magnetic permeability $\mu_w$ lowers in the widthwise direction of layer 33.

When the phase-shift type oscillation circuit (magnetic-field sensor) is so constituted that its oscillation frequency coincides with the ¼ wavelength tuning frequency $f_c$ of the transmission-line element, the tuning frequency $f_c$ is given by the following equation (17):

$$f_c = \frac{1}{4lc} \frac{1}{\sqrt{L_0 C_0}} \quad (17)$$
$$= \frac{1}{4l_c \sqrt{KC_0}} \frac{1}{\sqrt{\mu_w}}$$
$$= f_{c0} \sqrt{1 + X}$$

where K denotes a proportionality constant (which depends upon the shape of the conductor layer and the dimension of the magnetic layer between the distributed inductance $L_0$ and magnetic permeability $\mu_w$ of the magnetic layer 33 in the widthwise direction, $f_{c0}$ indicates an oscillation frequency when the external magnetic field Hext. is zero, and $l_c$ shows a line length. X in the above equation (17) is thus given by the following equation (18):

$$X = \frac{H_{ext} - N_D \cdot I_D / \mu_0}{H_{ki} + N_w \cdot I_s / \mu_0} \quad (18)$$

Figure 10:
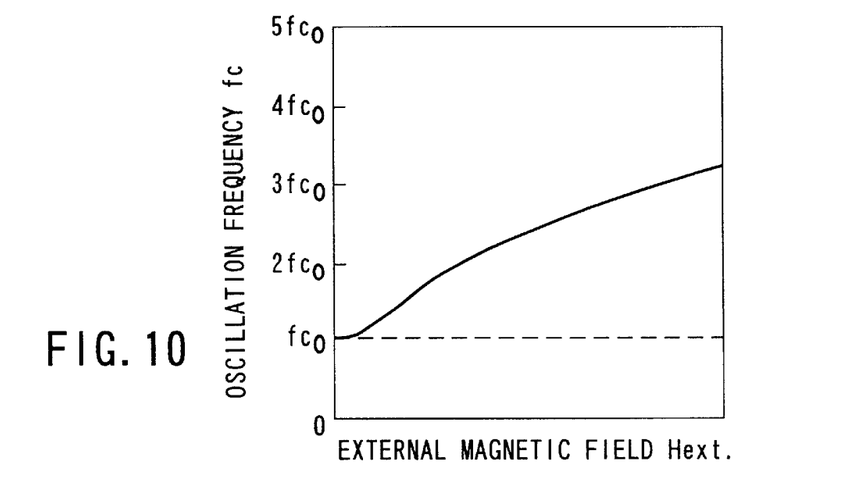
FIG. 10 is a graph showing a relationship between external magnetic field $H_{ext}$ and oscillation frequency fc of a phase-shift type oscillation circuit.

FIG. 10 shows a relationship between the external magnetic field $H_{ext}$ and the oscillation frequency $f_{c0}$ of the phase-shift type oscillation circuit. In FIG. 10, a dead band is caused on the low-magnetic-field side for the following reason: the effective magnetic field Ho becomes low since the antimagnetic field of magnetic layer 33 in the longitudinal direction is increased (ID→Is) by the external magnetic field $H_{ext}$.

If the magnetization intensity $I_D$ becomes saturated and reaches the saturation magnetization Is, an increase of the external magnetic field $H_{ext}$ is regarded as that of the effective magnetic field $H_0$. The oscillation frequency $f_c$ therefore varies greatly.

To reduce the dead band, it is effective to thin magnetic layer 33 and increase the aspect ratio (D/W) thereby lowering the antimagnetic field in the longitudinal direction.

Figure 11:
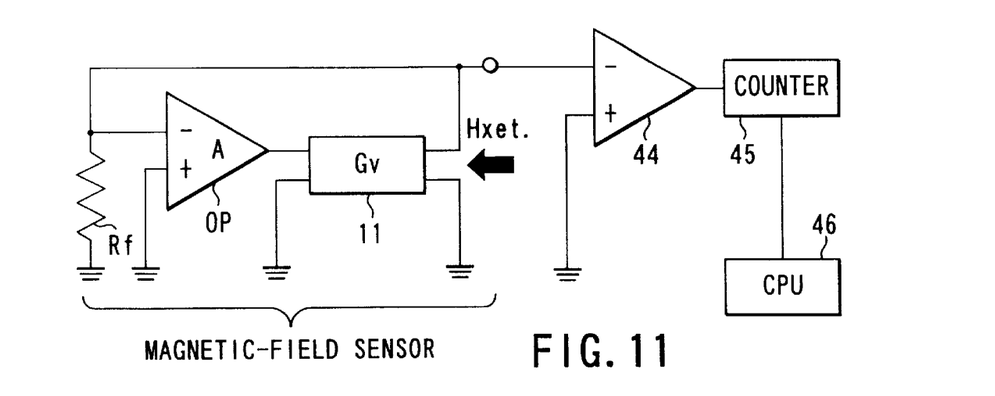
FIG. 11 is a block diagram schematically showing an example of a sensor system.

FIG. 11 illustrates an example of a sensor system employing the foregoing magnetic-field sensor. The sensor system is so constituted that sine-wave outputs of the magnetic-field sensor are converted to repetitive pulses using a comparator (in some cases using a hysteresis comparator) 44, the pulses are counted by a frequency counter (binary counter) 45, and the counted pulses are stored in a CPU 26.

In the case of a magnetic-field sensor (shown in FIG. 2) using an open-loop operational amplifier OP as an amplifier, a phase delay $\theta_B$ of the operational amplifier OP is about $\pi/2$ at a frequency which is considerably higher than the cutoff frequency of an open-loop gain. The oscillation frequency $f_c$ is thus almost coincident with the ¼ wavelength tuning frequency $f_c$ of transmission-line element 11.

If, then, the input impedance of the operational amplifier OP is considerably higher than the resistance $R_f$ and the output impedance thereof is considerably lower than the input impedance $Z_{in}$ of transmission-line element 11, the feedback gain $B_0$ is expressed by the following equation (19):

$$B_0 = \frac{R_f}{Z_C} \quad (19)$$

When $R_f > Z_c$, $B_0 > 1$. Thus, the amplification gain $A_0$ for satisfying the continuation oscillation conditions need not be heightened. If, however, Rf>$Z_c$, the input impedance $Z_{in}$ of transmission-line element 11 becomes lower than the characteristic impedance $Z_c$. Since, in this case, the driving capability of the operational amplifier OP may reach its limits, an appropriate value is chosen.

The following equation (20) is obtained from the above equation (17):

$$f_c^2 - f_{c0}^2 = f_{c0}^2 \cdot X \quad (20)$$

The equation (20) shows that $f_c^2 - f_{c0}^2$ is directly proportional to the external magnetic field $H_{ext}$ if the oscillation frequency when no magnetic field is applied is $f_{c0}$ and the oscillation frequency when the external magnetic field $H_{ext}$ is applied is $f_c$. By performing an operation using the equation (20), a relationship between the operation result and measured magnetic field can be linearized.

If, therefore, a CPU 46 performs an operation using the equation (20) based on the data counted by frequency counter 45, an external magnetic field can be sensed correctly.

As described above, the magnetic-field sensor senses an external magnetic field by means of a so-called frequency modulation system based on variations in oscillation frequency proportional to the intensity of the external magnetic field. The sensor is thus unsusceptible to an influence of ambient noise and can be constituted of only the phase-shift type oscillation circuit using a transmission-line element. Consequently, a peripheral analog electronic circuit can be reduced in size and thus a sensor system can be achieved by a very simple structure, with the result that the sensor can be decreased in size and cost and improved greatly in reliability.

The prior art magnetic-field sensor was designed to sense an external magnetic field by a so-called amplitude modulation system and thus had a disadvantage that a peripheral analog electronic circuit was increased in size and susceptible to noise. In contrast, according to the magnetic-field sensor of the present invention, the peripheral circuit can be constituted of the fewest possible analog electronic circuits and the influence of ambient noise can be lessened very greatly.

In particular, according to the sensor system shown in FIG. 11, when an oscillation frequency is counted by frequency counter 45, the detection precision of magnetic fields depends upon the sampling time of counter 45. A magnetic field generated by direct current and a magnetic field of a low frequency (which is much lower than the oscillation frequency) can thus be sensed with high precision.

In order to enable a high-frequency magnetic field to be sensed with high precision, a frequency-modulated high-frequency magnetic-field signal has only to be amplitude-modulated by a demodulation circuit.

As described above, an output of the sensor can be detected as a variation in frequency proportional to the intensity of the external magnetic field. In other words, the transmission-line element is inserted in the feedback circuit of the phase-shift type oscillation circuit using the open-loop operational amplifier as an amplifier, and the variation in frequency is detected as an output of the sensor. Therefore, the magnetic-field sensor of a frequency-modulation type can be so constructed that its peripheral circuit is formed of the fewest possible analog circuits and it is unsusceptible to ambient noise. Consequently, the entire constitution of the sensor system including the peripheral circuits can be very reduced, thereby decreasing in costs greatly.

In particular, a relationship between a result $(f_c^2 - f_{c0}^2)$ obtained from the square of the oscillation frequency and an external magnetic field is linear, and its proportionality constant is related to the square of the oscillation frequency $f_{c0}$ when no magnetic field is applied. Therefore, the ¼ wavelength tuning frequency, which is attained by miniaturizing the transmission-line, yields a significant improvement in sensor sensitivity.

The foregoing first embodiment is directed to a phase-shift type oscillation circuit using an open-loop operational amplifier as an amplifier.

The present invention is not limited to this, but can be applied to a phase-shift type oscillation circuit using an inverting amplifier including an (FET) (operational amplifier).

Figure 12:
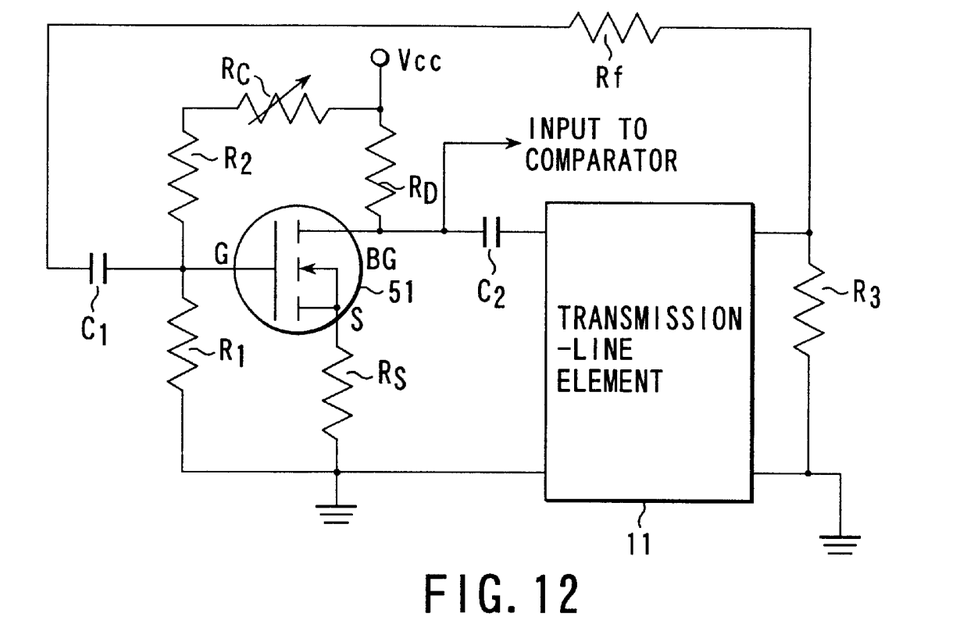
FIG. 12 is a circuit diagram schematically showing a magnetic-field sensor using an inverting amplifier (FET) according to a second embodiment of the present invention.

(Second Embodiment) FIG. 12 schematically showing a magnetic-field sensor (sensor circuit) according to a second embodiment of the present invention, using an inverting amplifier including an FET as an amplifier of a phase-shift type oscillation circuit. The magnetic-field sensor is designed to oscillate at about ½ wavelength tuning frequency $2f_c$ of transmission-line element 11.

The gate (G) of an n-channel FET 51 is connected to one electrode of a capacitor $C_1$ and one end of each of resistors $R_1$ and $R_2$. The other electrode of the capacitor $C_1$ is connected to the transmission-line element 11 and one end of a resistor $R_3$ through a resistor Rf. The other end of the resistor $R_3$ is connected to element 11 and grounded.

The other end of the resistor $R_1$ is connected to one end of a resistor $R_s$ and the element 11, and grounded. The other end of the resistor $R_s$ is connected to the source (S) and back gate (BG) of FET 51.

A reference power supply Vcc is connected to the other end of the resistor $R_2$ via a variable resistor $R_c$ and one end of a resistor $R_D$. The other end of the resistor $R_D$ is connected to the drain (D) of the FET 51 and transmission-line element 11 through a capacitor $C_2$.

The potential of a node between the resistor $R_D$ and capacitor $C_2$ is employed as an input to a comparator when a sensor system is formed.

Though, in the magnetic-field sensor of the second embodiment, the oscillation frequency is rather unstable, the external magnetic field is varied with the frequency as in the magnetic-field sensor of the first embodiment shown in FIG. 2.

The present invention is not limited to the foregoing open-loop operational amplifier or inverting amplifier (FET) as a phase-shift type oscillation circuit constituting a sensor circuit. For example, a bipolar transistor can be employed or a minor-loop (negative feedback) operational amplifier can be used to control both an amplifier gain and a phase delay.

(Third Embodiment)

Figure 13:
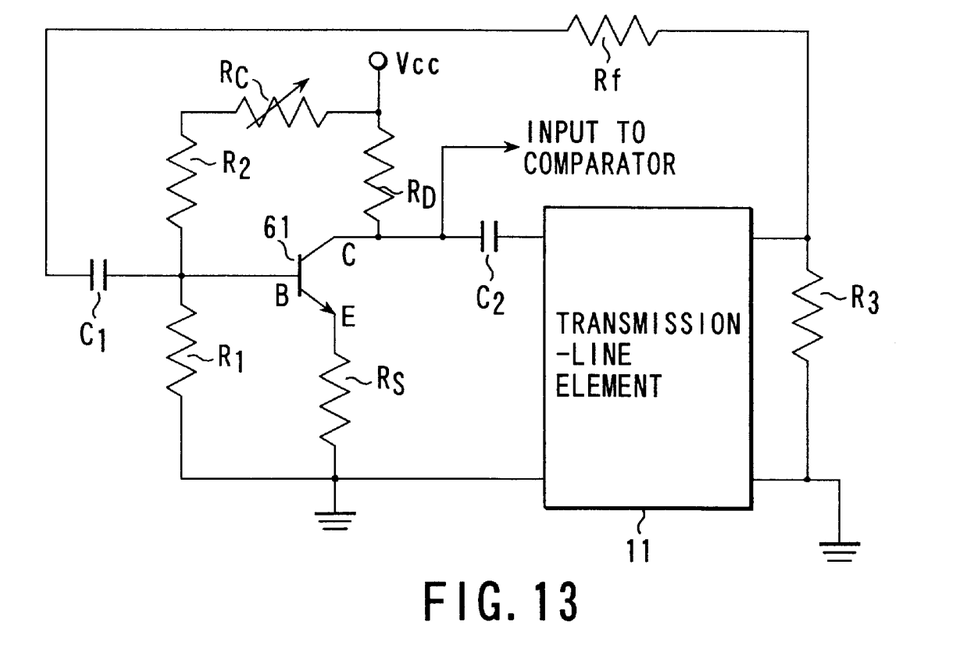
FIG. 13 is a circuit diagram schematically showing a magnetic-field sensor using a bipolar transistor according to a third embodiment of the present invention.

FIG. 13 shows a circuit arrangement of a magnetic-field sensor (sensor circuit) according to a third embodiment of the present invention. In the third embodiment, a bipolar transistor is used as an amplifier of a phase-shift type oscillation circuit in the magnetic-field sensor of the second embodiment. The same components as those of the second embodiment are indicated by the same reference numerals and their detailed descriptions are omitted.

In the magnetic-field sensor of the third embodiment, the base (B) of an N-P-N transistor 61 is connected to a node of resistors $R_1$ and $R_2$ of a capacitor $C_1$. The collector (C) of transistor 61 is connected to a node between a resistor $R_D$ and a capacitor $C_2$, and the emitter (E) thereof is connected to one end of a resistor $R_s$ which is opposite to a ground.

Even in the magnetic-field sensor so constituted, the same advantages as those of the sensors of the first and second embodiments shown in FIGS. 2 and 12, respectively, can be expected.

Figure 14A:
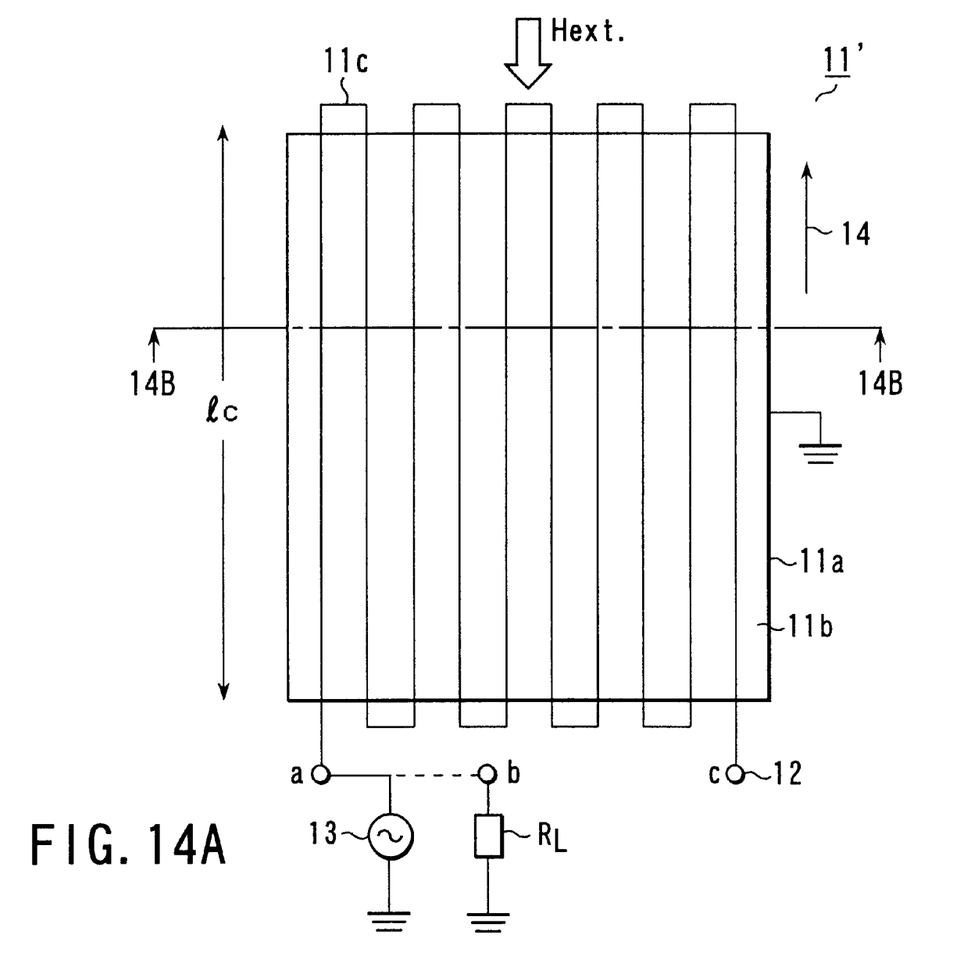
FIG. 14A is a schematic plan view showing another structure of the transmission-line element.
Figure 14B:
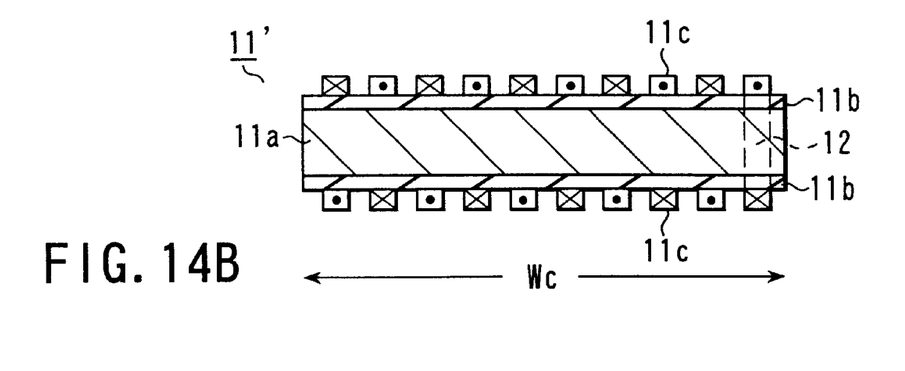
FIG. 14B is a schematic cross-sectional view of the transmission-line element taken along line 14B—14B of FIG. 14A.

FIGS. 14A and 14B illustrate another transmission-line element 11' used in the magnetic-field sensor. FIG. 14A is a schematic (partly-simplified) plan view thereof, and FIG. 14B is a cross-sectional view taken along line 14B—14B. In transmission-line element 11', a conductor layer 11c is formed to have a snaky plane pattern Transmission-line element 11' has a multilayer structure in which an almost rectangular soft-magnetic metal layer (magnetic layer) 11a having a length $l_c$ and a width $W_c$, is interposed between upper and lower dielectric layers 11b, and upper and lower conductor lines 11c serving as conductor layers having a snaky plane pattern are formed on their respective surfaces of upper and lower dielectric layers 11b.

Upper and lower conductor lines 11c are connected to each other at a contact portion (point c) 12. One end (point a) of the upper and lower conductor lines 11c is grounded via an AC power supply 13, and so is the other end (point b) thereof via a resistor $R_L$.

Even when transmission-line element 11' is used in a feedback circuit of the phase-shift type oscillation circuit, the same advantages as those of transmission-line element 11 including conductor lines 11c having a spiral plane pattern, as shown in FIGS. 4A and 4B, can be expected.

It is needless to say that various changes and modifications can be made without departing from the scope of the subject matter of the present invention.

As described in detail above, the present invention provides a frequency-modulation type magnetic-field sensor. An output of the sensor can be detected a variation in frequency proportional to the strength of an external magnetic field. Since, thus, the entire structure of the sensor including the peripheral circuit can be greatly simplified, the peripheral circuit can be constituted of the fewest possible analog electronic circuits. Consequently, the sensor decreases in size and cost and is very unsusceptible to noise.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic-field sensor of a phase-shift type, comprising:
    an oscillation circuit including a feedback circuit; and
    a transmission-line element which is provided in the feedback circuit and whose phase is shifted in accordance with intensity of an external magnetic field, the transmission-line element including a conductor layer and a magnetic layer.

2. A magnetic-field sensor according to claim 1, wherein the oscillation circuit includes an amplifier, and the amplifier is constituted using an open-loop operational amplifier.

3. A magnetic-field sensor according to claim 1, wherein the oscillation circuit includes an amplifier, and the amplifier is constituted using an inverting amplifier as an operational amplifier.

4. A magnetic-field sensor according to claim 1, wherein the oscillation circuit includes an amplifier, and the amplifier is constituted of a bipolar transistor.

5. A magnetic-field sensor according to claim 1, wherein the oscillation circuit includes an amplifier, and the amplifier is constituted using an electric-field transistor.

6. A magnetic-field sensor according to claim 1, wherein the transmission-line element includes dielectric layers and has a multilayer structure in which the dielectric layers are formed on the top and bottom surfaces of the magnetic layer and the conductor layer is formed on respective dielectric layers.

7. A magnetic-field sensor according to claim 6, wherein the magnetic layer is constituted of one of a rectangular thin soft magnetic band and a rectangular thin soft magnetic film and provided with uniaxial magnetic anisotropy in a longitudinal direction thereof.

8. A magnetic-field sensor according to claim 6, wherein the magnetic layer has a magnetization easy axis which is almost parallel with the conductor layers.

9. A magnetic-field sensor according to claim 6, wherein the magnetic layer is constituted of metal materials and set at a ground potential if necessary.

10. A magnetic-field sensor according to claim 6, wherein the conductor layers have an alternating current magnetic field having a frequency corresponding to an oscillation frequency, and the alternating current magnetic field is applied to the magnetic layers in a widthwise direction thereof.

11. A magnetic-field sensor according to claim 6, wherein the conductor layers are formed in a plane pattern having a predetermined shape.

12. A magnetic-field sensor according to claim 11, wherein the plane pattern is spiral.

13. A magnetic-field sensor according to claim 11, wherein the plane pattern is snaky.

14. A magnetic-field sensor according to claim 1, wherein the transmission-line element includes dielectric layers and has a multilayer structure in which the dielectric layers are formed on the top and bottom surfaces of the conductor layer and the magnetic layer is formed on respective dielectric layers.

15. A magnetic-field sensor according to claim 14, wherein the magnetic layers are each constituted of one of a rectangular thin soft magnetic band and a rectangular thin soft magnetic film and provided with uniaxial magnetic anisotropy in a longitudinal direction thereof.

16. A magnetic-field sensor according to claim 14, wherein the magnetic layers each have a magnetization easy axis which is almost parallel with the conductor layers.

17. A magnetic-field sensor according to claim 14, wherein the dielectric layers are electrically grounded.

18. A magnetic-field sensor according to claim 14, wherein the conductor layer has an alternating current magnetic field having a frequency corresponding to an oscillation frequency, and the alternating current magnetic field is applied to the magnetic layers in a widthwise direction thereof.

19. A magnetic-field sensor according to claim 14, wherein the conductor layer is formed in a plane pattern having a predetermined shape.

20. A magnetic-field sensor according to claim 19, wherein the plane pattern is spiral.

21. A magnetic-field sensor according to claim 19, wherein the plane pattern is snaky.

22. A magneticfield sensor according to claim 1, wherein the conductor layer is excited by an AC power supply.

23. A magnetic-field sensor according to claim 1, wherein the magnetic layer is varied in magnetic permeability with the external magnetic field.

* * * * *